(12) United States Patent
Chen et al.

(10) Patent No.: US 9,823,706 B2
(45) Date of Patent: Nov. 21, 2017

(54) HINGE COMPONENT AND THE ELECTRONIC DEVICE USING THEREOF

(71) Applicant: ASUSTeK COMPUTER INC., Taipei (TW)

(72) Inventors: Chien-Hsun Chen, Taipei (TW); Yen-Chung Chen, Taipei (TW); Yu-Kang Lin, Taipei (TW); Chung-Chieh Huang, Taipei (TW)

(73) Assignee: AUSUTEK COMPUTER INC., Taipei (TW)

( * ) Notice: Subject to any disclaimer, the term of this patent is extended or adjusted under 35 U.S.C. 154(b) by 0 days.

(21) Appl. No.: 15/446,046

(22) Filed: Mar. 1, 2017

(65) Prior Publication Data

US 2017/0257961 A1 Sep. 7, 2017

(30) Foreign Application Priority Data

Mar. 7, 2016 (TW) .............................. 105203103 U

(51) Int. Cl.
*G06F 1/16* (2006.01)
*H04M 1/00* (2006.01)
(Continued)

(52) U.S. Cl.
CPC ............. *G06F 1/1681* (2013.01); *E05D 3/02* (2013.01); *E05D 11/105* (2013.01); *F16C 11/04* (2013.01);
(Continued)

(58) Field of Classification Search
CPC .... G06F 1/1681; G06F 1/1613; G06F 1/1615; G06F 1/1624; H05K 5/0226
(Continued)

(56) References Cited

U.S. PATENT DOCUMENTS 9,317,071 B2 * 4/2016 Fan ....................... G06F 1/1681
9,366,064 B1 * 6/2016 Chen ........................ E05D 3/12
(Continued)

FOREIGN PATENT DOCUMENTS

CN 201779130 U 3/2011
CN 104565014 A 4/2015
(Continued)

OTHER PUBLICATIONS

Search report issued in corresponding EP patent application dated Jul. 17, 2017.
(Continued)

*Primary Examiner* — Nidhi Thaker
(74) *Attorney, Agent, or Firm* — McClure, Qualey & Rodack, LLP

(57) ABSTRACT

A hinge component for an electronic device includes a fixing member, a rotating member and a central shaft. The fixing member includes a side plate and two fixing plates, a curved guiding rail is formed on the side plate. The rotating member includes a rotating portion, a connecting portion and an engaging portion. The fixing member and the rotating member are assembled to the casing and the back plate of the electronic device. The fixing member is disposed inside the casing but not exposed. As a result, the electronic device is made thinner. The hinge component is not easily damaged under an external force, and the lifecycle of the hinge component is improved. The rotating portion rotates around the connection of the back plate and the casing as a virtual rotating axis. At the same time, the central shaft is driven to slide in the curved guiding rail.

10 Claims, 10 Drawing Sheets

(51) Int. Cl.
*H05K 5/02* (2006.01)
*E05D 3/02* (2006.01)
*E05D 11/10* (2006.01)
*F16C 11/04* (2006.01)

(52) U.S. Cl.
CPC .......... *G06F 1/1613* (2013.01); *G06F 1/1615* (2013.01); *H05K 5/0226* (2013.01)

(58) Field of Classification Search
USPC ............ 361/679.55; 455/575.1, 575.3, 575.4
See application file for complete search history.

(56) References Cited

U.S. PATENT DOCUMENTS

| | | | |
|---|---|---|---|
| 9,404,298 B1 * | 8/2016 | Chen | G06F 1/1681 |
| 2007/0267428 A1 * | 11/2007 | Peng | G06F 1/1616 |
| | | | 220/827 |
| 2010/0024171 A1 | 2/2010 | Wang | |
| 2011/0023270 A1 * | 2/2011 | Kim | E05D 11/1014 |
| | | | 16/297 |
| 2011/0154615 A1 | 6/2011 | Shen | |
| 2011/0304983 A1 * | 12/2011 | Senatori | G06F 1/1616 |
| | | | 361/679.55 |
| 2012/0160984 A1 * | 6/2012 | Hsiao | G06F 1/1681 |
| | | | 248/571 |
| 2013/0176663 A1 | 7/2013 | Liao et al. | |
| 2014/0168878 A1 * | 6/2014 | Jheng | G06F 1/1681 |
| | | | 361/679.27 |
| 2014/0211416 A1 * | 7/2014 | Fan | G06F 1/1681 |
| | | | 361/679.55 |
| 2015/0192965 A1 * | 7/2015 | Chang | G06F 1/1681 |
| | | | 361/679.56 |
| 2017/0138103 A1 * | 5/2017 | Hong | E05D 3/18 |
| 2017/0139446 A1 * | 5/2017 | Lan | G06F 1/1681 |
| 2017/0208703 A1 * | 7/2017 | Lin | E05F 1/1016 |
| 2017/0257961 A1 * | 9/2017 | Chen | H05K 5/0226 |
| 2017/0269637 A1 * | 9/2017 | Lin | G06F 1/1681 |

FOREIGN PATENT DOCUMENTS

| | | |
|---|---|---|
| EP | 2383626 | 11/2011 |
| JP | H0235214 U | 3/1990 |
| JP | 2005327918 A | 11/2005 |

OTHER PUBLICATIONS

Office Action issued in corresponding Japan patent application dated Jun. 20, 2017.

* cited by examiner

HINGE COMPONENT AND THE ELECTRONIC DEVICE USING THEREOF

CROSS-REFERENCE TO RELATED APPLICATION

This application claims the priority benefit of TW application serial No. 105203103, filed on Mar. 7, 2016. The entirety of the above-mentioned patent application is hereby incorporated by reference herein and made a part of specification.

BACKGROUND OF THE INVENTION

Field of the Invention

The disclosure relates to a hinge component and, more specifically, to a hinge component applied to an electronic device.

Description of the Related Art

Pursuing to light, small, thin and powerful functionalities, smart phones and tablet computers become more and more popular and gradually replace notebooks and portable DVD players. Currently, when users use the smart phone or the tablet computer to read articles or watch audio-visual programs or movies, a support is required to make the smart phone or the tablet computer to stand in a suitable viewing angle.

A support for an electronic device is separately installed to the electronic device or is formed by folding a protecting cover. A conventional protecting cover is made of paper or plastic that enveloped by leather or plastic. However, the service life is short due to the low mechanical strength of the material. The support that installed to the electronic device is usually via a pivot, which has higher mechanical strength but users have to bring it additionally. And the rotating angle is limited by the pivot. Furthermore, the pivot is usually exposed out of the electronic device for easily docked with the support. As a result, the appearance is impact. Moreover, the contact between the electronic device and the support is easily to be detached or damaged due to a collision or a shock, which affects the stability and use life of the pivot.

BRIEF SUMMARY OF THE INVENTION

According to an aspect, a hinge component is provided. The hinge component is applied to an electronic device having a casing and a back plate. The hinge component includes a fixing member, a rotating member and a central shaft. The fixing member includes a side plate and two fixing plates. The fixing plates extend from two ends of the side plate toward a direction. And a curved guiding rail is formed on the side plate. The rotating member includes a rotating portion, a connecting portion and an engaging portion. The rotating portion includes a first through hole. The connecting portion is connected to the rotating portion. The engaging portion extends from the connecting portion. The central shaft passes through the first through hole and the curved guiding rail, two ends of the central shaft are fastened to the rotating portion and the side plate, respectively, to fix the rotating portion on the side plate. When the engaging portion is driven to make the rotating portion rotate, the central shaft is driven to slide along the curved guiding rail, wherein, when the central shaft is in a first position of the curved guiding rail. The engaging portion is parallel to the two fixing plates, when the rotating portion rotates to make the central shaft move to a second position of the curved guiding rail, an angle is formed between the engaging portion and the fixing plate.

According to an aspect, an electronic device comprising a casing, a back plate and a hinge component is provided. The hinge component is configured on two sides of the casing and the back plate in pairs and symmetrically. The hinge component includes a fixing member, a rotating member and a central shaft. The fixing member includes a side plate and two fixing plates, the fixing plates extend from two ends of the side plate towards a direction, a curved guiding rail is formed on the side plate, the rotating member including a rotating portion, a connecting portion and an engaging portion, the rotating portion includes a first through hole, the connecting portion is connected to the rotating portion, the engaging portion extends from the connecting portion; and the central shaft, passing through the first through hole and the curved guiding rail, two ends of the central shaft are fastened to the rotating portion and the side plate, respectively, to fix the rotating portion on the side plate, when the engaging portion is driven to make the rotating portion rotate, the central shaft is driven to slide along the curved guiding rail; wherein when the central shaft is in a first position of the curved guiding rail, the engaging portion is parallel to the two fixing plates, when the rotating portion rotates to make the central shaft move to a second position of the curved guiding rail, an angle is formed between the engaging portion and the fixing plate.

The hinge component disclosed herein is applied to an electronic device having a casing and a back plate. In an embodiment, the back plate is optionally configured as a support which has varies adjustable supporting angles of the electronic device. The hinge component is disposed inside the casing to keep the appearance of the electronic device simple and neat. As a result, the hinge component is not easily damaged under an external force thus the lifecycle of the hinge component is improved.

BRIEF DESCRIPTION OF THE DRAWINGS

These and other features, aspects and advantages of the disclosure will become better understood with regard to the following embodiments and accompanying drawings.

FIGS is a schematic diagram showing the assembly of a hinge component in an embodiment.

Figure 6:
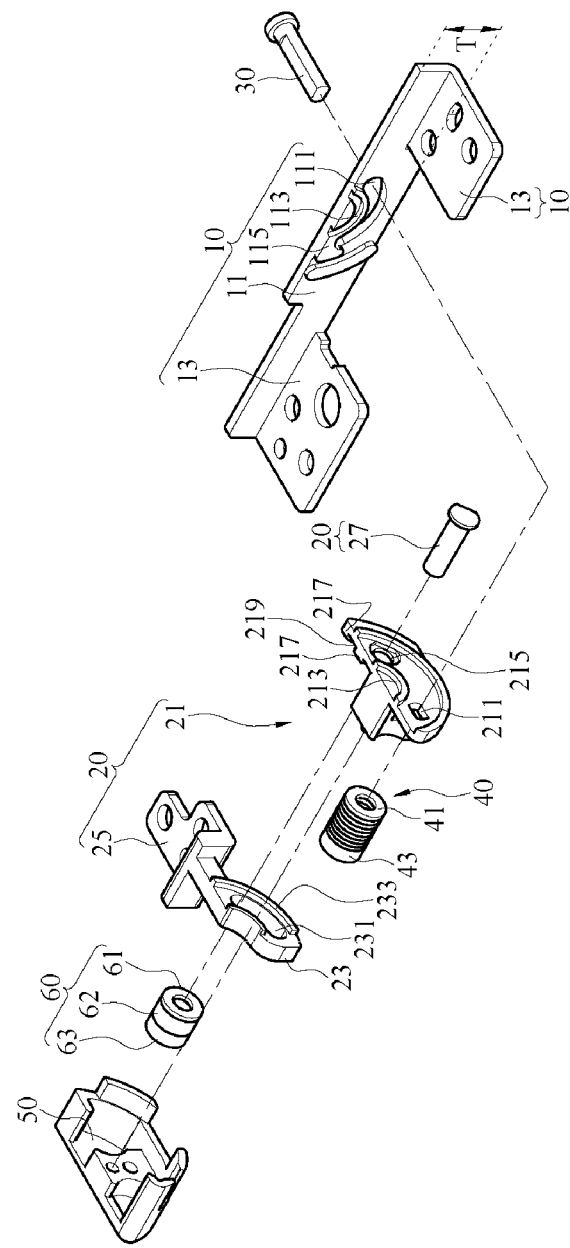

FIG. 6 is an exploded diagram showing a hinge component in an embodiment.

Figure 7A:
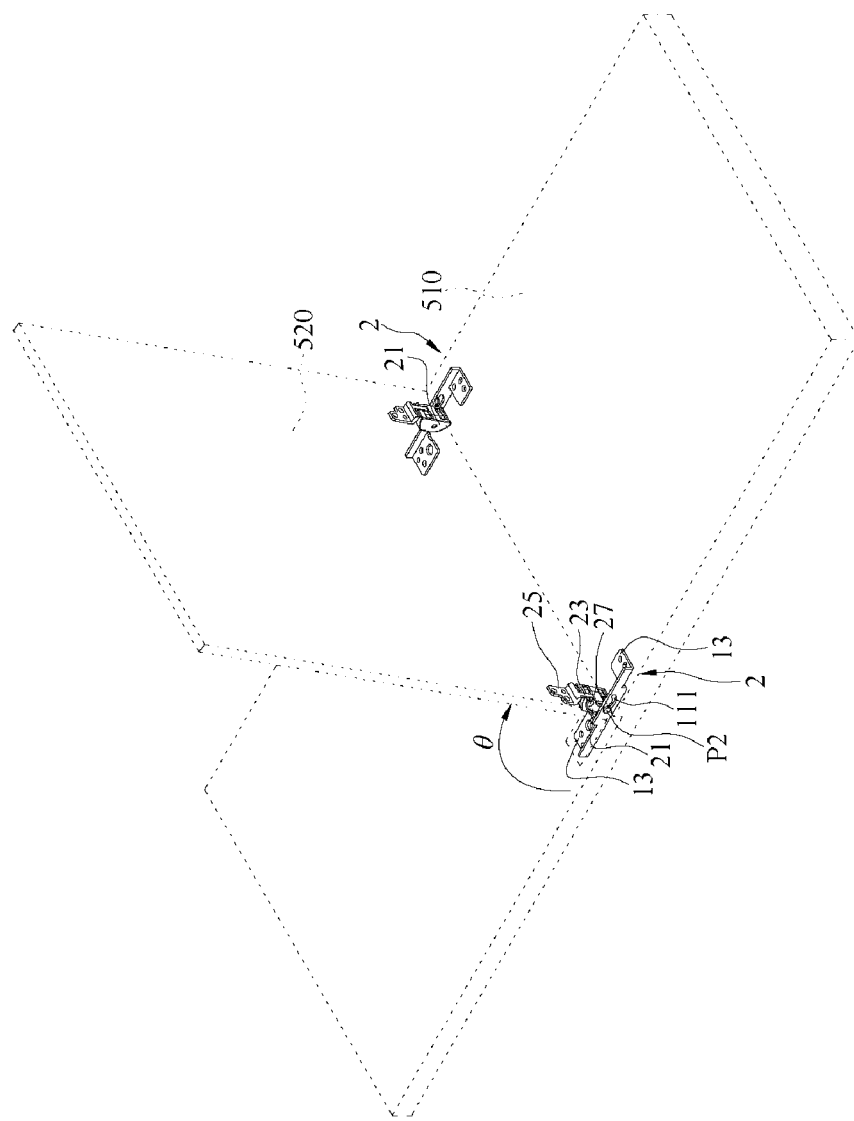

FIG. 7A is a schematic diagram showing a state of an electronic device in practical application in an embodiment.

Figure 7B:
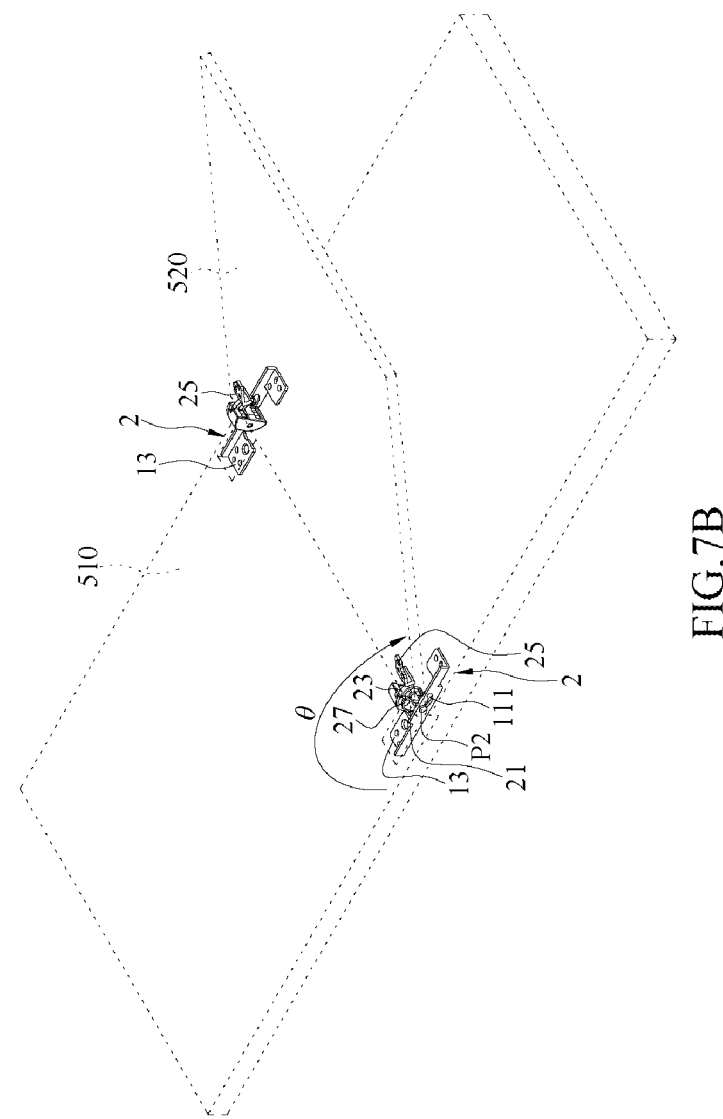

FIG. 7B is a schematic diagram showing a state of an electronic device in practical application in an embodiment.

Figure 8A:
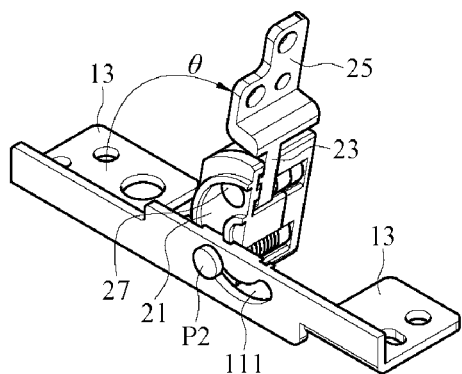

FIG. 8A is a schematic diagram showing a state of a hinge component in an embodiment.

Figure 8B:
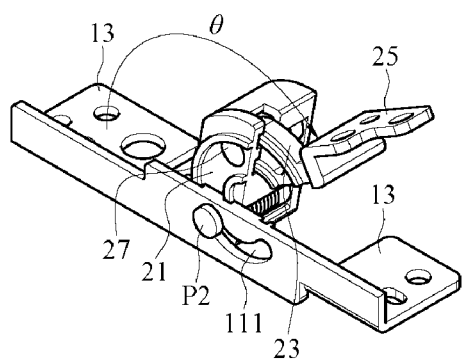

FIG. 8B is a schematic diagram showing a state of a hinge component in an embodiment.

DETAILED DESCRIPTION OF THE EMBODIMENTS

Figure 1:
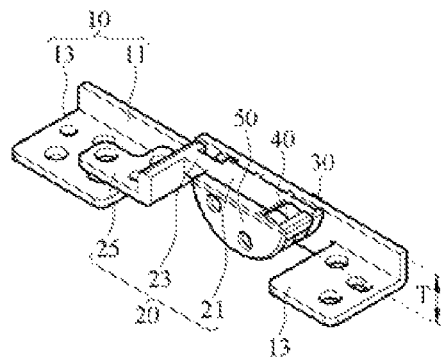
FIG. 1 is a schematic diagram showing the assembly of a hinge component in an embodiment.
Figure 2:
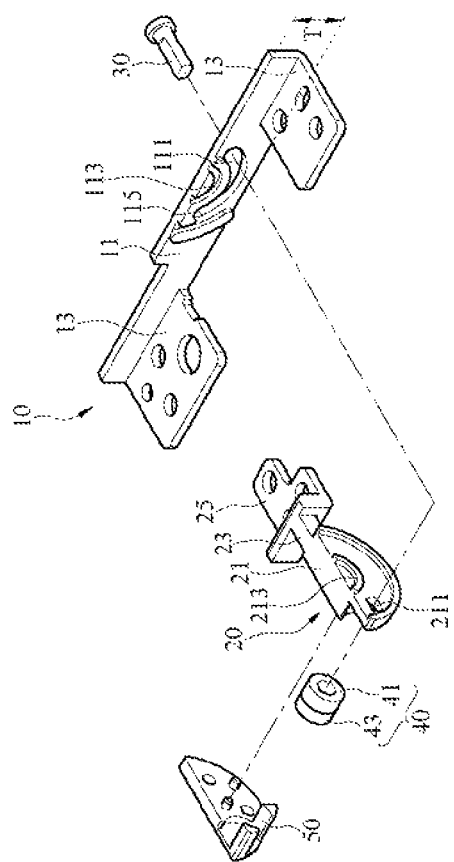
FIG. 2 is an exploded diagram showing a hinge component in an embodiment.

Please refer to FIG. 1 and FIG. 2. FIG. 1 is a schematic diagram showing the assembly of a hinge component in a first embodiment. FIG. 2 is an exploded diagram showing a hinge component in a first embodiment. As shown in FIG. 1 and FIG. 2, a hinge component 1 includes a fixing member 10, a rotating member 20 and a central shaft 30. The fixing member 10 includes a side plate 11 and two fixing plates 13. The two fixing plates 13 extend from two ends of the side plate 11 towards a direction, respectively. The two fixing plates 13 are configured in parallel and perpendicular to the side plate 11, which is not limited herein. A curved guiding rail 111 formed on the side plate 11 passes through the side plate 11.

The rotating member 20 includes a rotating portion 21, a connecting portion 23 and an engaging portion 25. The rotating portion 21 includes a first through hole 211. The connecting portion 23 is connected to the rotating portion 21. The engaging portion 25 extends from the connecting portion 23. The central shaft 30 passes through the first through hole 211 and the curved guiding rail 111. Two ends of the central shaft 30 are fastened to the rotating portion 21 and the side plate 11, respectively, to fix the rotating portion 21 at the side plate 11. When the engaging portion 25 is driven to make the rotating portion 21 rotate, the central shaft 30 is driven to slide along the curved guiding rail 111.

The hinge component 1 further includes a torsion device 40. The torsion device 40 is configured on the central shaft 30 and abutted against the rotating portion 21. The torsion device 40 includes a first elastic sheet 41 and a first nut 43. The first elastic sheet 41 is ring shaped or tube shaped. The first elastic sheet 41 is sleeved on the central shaft 30 and abutted against the rotating portion 21. The first nut 43 is sleeved on the central shaft 30 and fixed the first elastic sheet 41 on the central shaft 30. The torsion for rotating the rotating portion 21 is provided by the first elastic sheet 41. A tightness degree of the first nut 43 directly affects the compression and the torsion of the first elastic sheet 41.

The hinge component 1 further includes a cover 50. The cover 50 is fixed on a side of the rotating portion 21 via a screw to shield the rotating portion 21 and the central shaft 30.

Figure 3A:
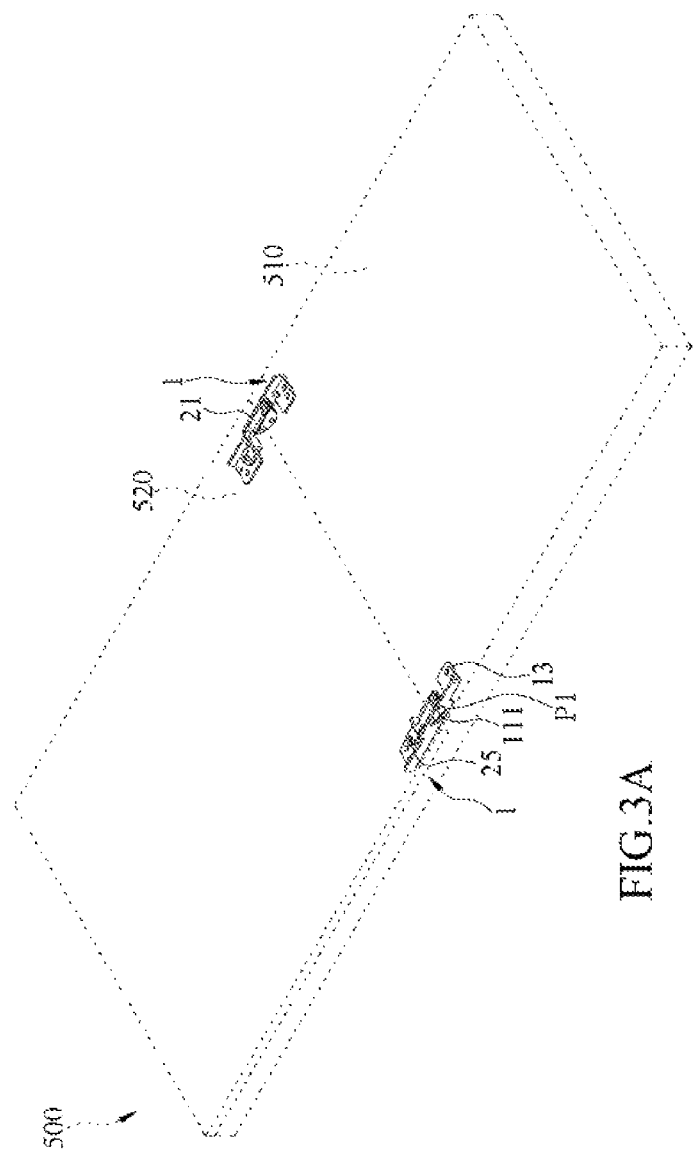
FIG. 3A is a schematic diagram showing a state of an electronic device in practical application in an embodiment.
Figure 3B:
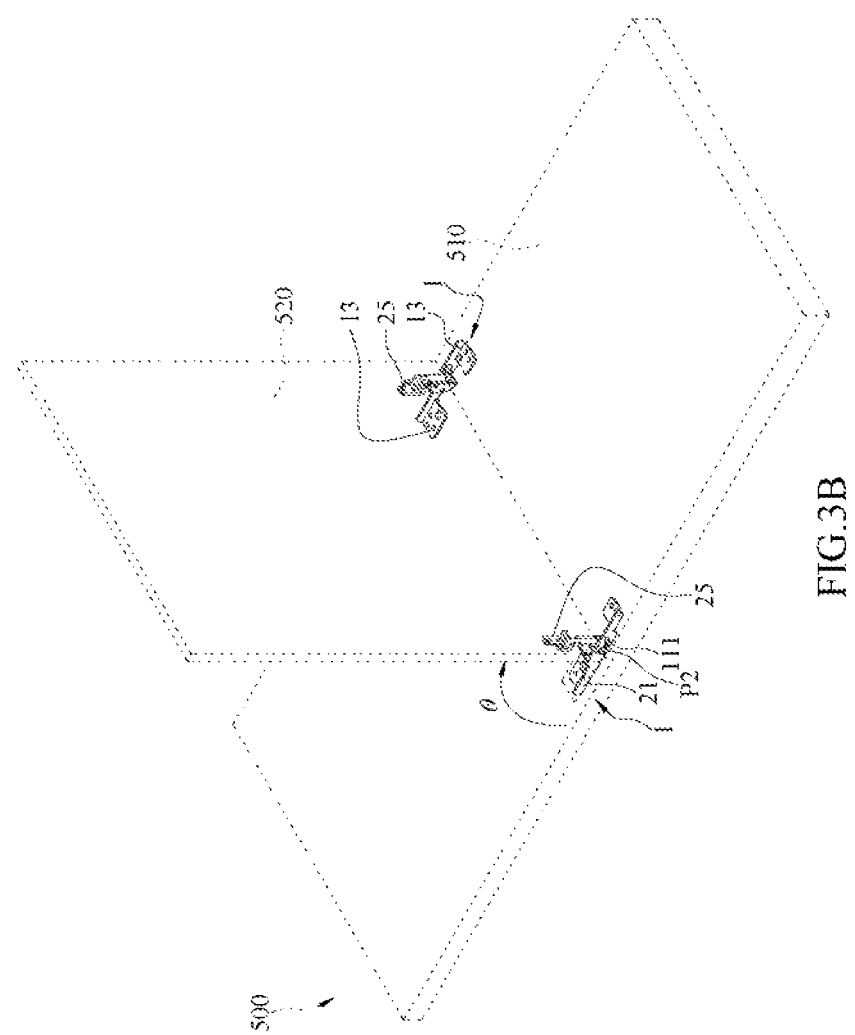
FIG. 3B is a schematic diagram showing a state of an electronic device in practical application in an embodiment.
Figure 3C:
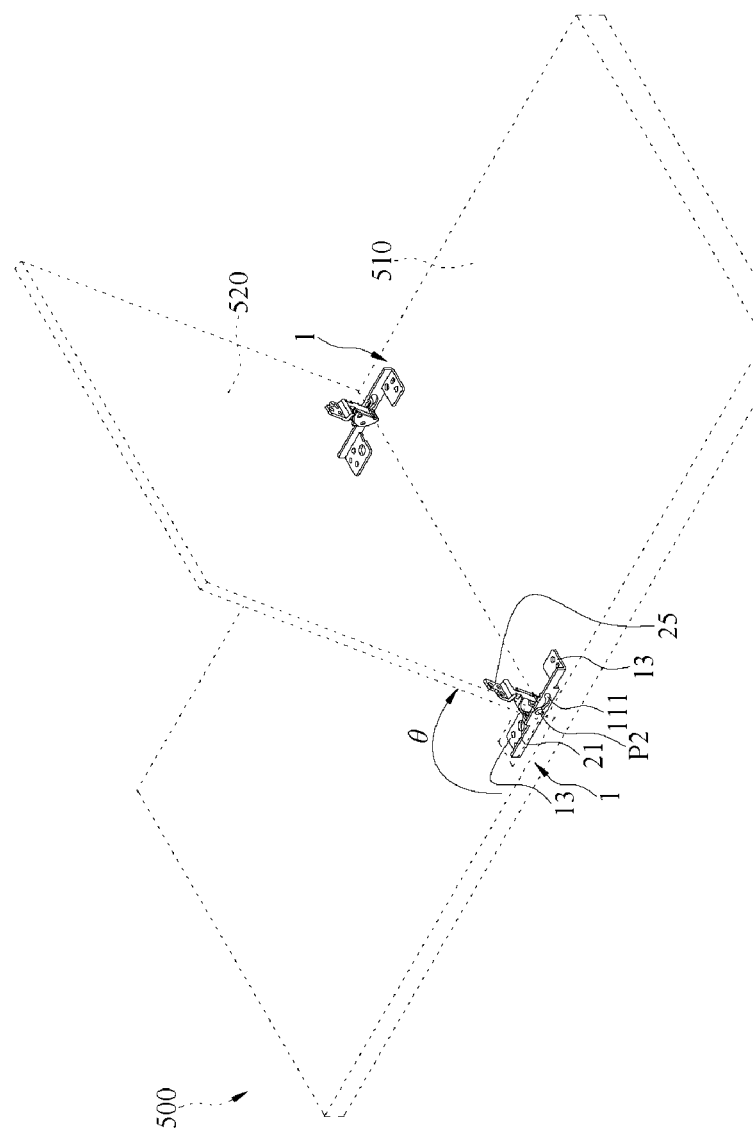
FIG. 3C is a schematic diagram showing a state of an electronic device in practical application in an embodiment.
Figure 4A:
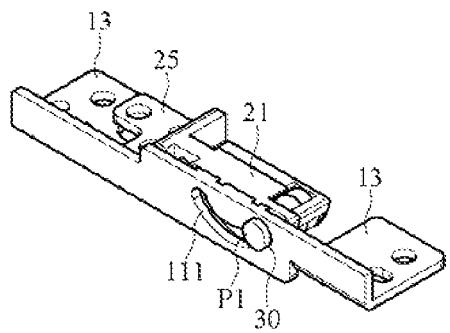
FIG. 4A is a schematic diagram showing a state of a hinge component in an embodiment.
Figure 4B:
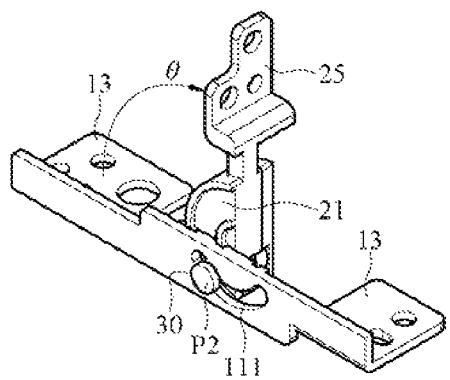
FIG. 4B is a schematic diagram showing a state of a hinge component in an embodiment.
Figure 4C:
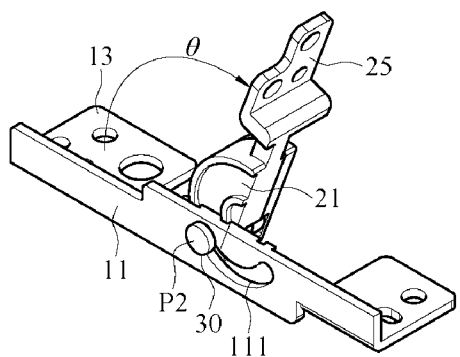
FIG. 4C is a schematic diagram showing a state of a hinge component in an embodiment.

Please refer to FIG. 3A to FIG. 3C and FIG. 4A to FIG. 4C. FIG. 3A to FIG. 3C are schematic diagrams showing states of an electronic device in practical application in a first embodiment. FIG. 4A to FIG. 4C are schematic diagrams showing states of a hinge component in a first embodiment.

As shown in FIG. 3A to FIG. 3C, an electronic device 500 comprising a casing 510, a back plate 520 and hinge components 1 is provided. The hinge components 1 are configured on two sides of the casing 510 and the back plate 520 in pairs and symmetrically. In an embodiment, the fixing plate 13 is fixed inside the casing 510 of the electronic device 500. The engaging portion 25 is fixed on the back plate 520 of the electronic device 500. Since the hinge components 1 are configured in pairs and symmetrically, a single hinge component 1 is used for the description in FIG. 4A to FIG. 4C for concise.

As shown in FIG. 3A and FIG. 4A, the hinge components 1 are disposed inside the casing 510 of the electronic device 500 for a neat appearance. In the status that the back plate 520 is not rotated relatively to the casing 510, the central shaft 30 of the hinge components 1 is located at a first position P1 of the curved guiding rail 111. The engaging portion 25 is parallel to the fixing plates 13. Please refer to FIG. 3B, FIG. 3C, FIG. 4B and FIG. 4C, during the process that the engaging portion 25 is driven to rotate the rotating portion 21, the rotating portion 21 is exposed. The rotating portion 21 rotates around a connection between the casing 510 and the back plate 520. As shown in FIG. 3C, the curved guiding rail 111 is the connection between the casing 510 and the back plate 520, and is taken as a virtual rotation axis. When the central shaft 30 is moved from the first position P1 to a second position P2 of the curved guiding rail 111, an angle θ is formed between the engaging portion 25 and the fixing plate 13.

Please refer to FIG. 3A, FIG. 4A, FIG. 1 and FIG. 2, the second position P2 is a position different from the first position P1 on the curved guiding rail 111. The angle θ between the engaging portion 25 and the fixing plate 13 is adjusted according to a thickness T of the side plate 11, the curved guiding rail 111 or the user's operation behavior. In an embodiment, as shown in FIG. 3B and FIG. 4B, when the central shaft 30 is in the second position P2, the angle θ formed between the engaging portion 25 and the fixing plate 13 is about 90 degrees. This means an angle θ formed between the casing 510 and the back plate 520 is also about 90 degrees. In another embodiment, as shown in FIG. 3C and FIG. 4C, when the central shaft 30 is in the second position P2, the angle θ formed between the engaging portion 25 and the fixing plate 13 is about 120 degrees. The angle θ formed between the casing 510 and the back plate 520 is also about 120 degrees. As previous described, the angle θ is varied according to the thickness T of the side plate 11, the curved guiding rail 111 or the user's operation behavior. Therefore, the angle is not limited herein. In an embodiment, the maximum angle θ formed between the engaging portion 25 and the fixing plate 13 is 180 degrees. That is, the range of the angle formed between the casing 510 and the back plate 520 is from 0 to 180 degrees.

Please refer to FIG. 2, the side plate 11 includes a position limiting portion 113 and an abutting portion 115. A first sliding block 213 is disposed on the rotating portion 21. The first sliding block 213 is disposed on a surface of the rotating portion 21 toward to the side plate 11. The position limiting portion 113 is disposed above the curved guiding rail 111 and located on a surface of the side plate 11 facing to the rotating portion 21. The position and shape of the position limiting portion 113 correspond to those of the first sliding block 213. The position limiting portion 113 is used to guide and limit a sliding trace of the first sliding block 213. The abutting portion 115 extends from the position limiting portion 113. The abutting portion 115 locates at an end of the curved guiding rail 111 which is close to the second position P2. When the central shaft 30 is moved to the second position P2, the central shaft 30 contacts with the abutting portion 115. Then, the abutting portion 115 is used to limit a maximum range of the movement of the central shaft 30.

Figure 5:
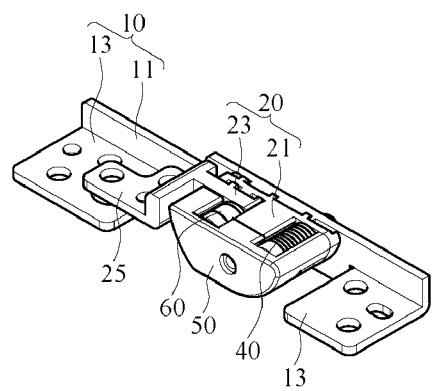

Please refer to FIG. 5 and FIG. 6. FIG. 5 is a schematic diagram showing the assembly of a hinge component in a second embodiment. FIG. 6 is an exploded diagram showing a hinge component in a second embodiment. As shown in FIG. 5 and FIG. 6, a hinge component 2 in the embodiment includes the fixing member 10, the rotating member 20 and the central shaft 30, which are similar to that of the hinge component 1 and not repeated herein. In addition, the hinge component 2 also includes the torsion device 40 and the cover 50.

In this embodiment, except for the rotating portion 21, the connecting portion 23 and the engaging portion 25, the second rotating member 20 of the hinge component 2 further includes a rotating axis 27. In the embodiment, the rotating portion 21 of the rotating member 20 is separated from the connecting portion 23. The engaging portion 25 is connected to the connecting portion 23. The rotating portion 21 and the engaging portion 25 are two individual components. The rotating portion 21 further includes a second through hole 215. The connecting portion 23 includes a through hole 231. The rotating axis 27 passes through the second through hole 215 and the through hole 231. Two ends of the rotating axis 27 are fastened in the rotating portion 21 and the connecting portion 23 to make the connecting portion 23 connected with the rotating portion 21.

Further, the hinge component 2 includes a torsion assembly 60. The torsion assembly 60 is configured to the rotating axis 27. The torsion assembly 60 includes a spacer 61, a second elastic sheet 62 and a second nut 63. The spacer 61 is sleeved on the rotating axis 27 and abutted against the connecting portion 23. The second elastic sheet 62 is sleeved on the rotating axis 27 and abutted against the spacer 61. The second nut 63 is sleeved on the rotating axis 27 to fix the spacer 61 and the second elastic sheet 62 on the rotating axis 27. As a result, in the adjustment, a torsion provided by the torsion device 40 corresponding to the rotating portion 21 is adjusted to be less than a torsion provided by the torsion assembly 60 corresponding to the connecting portion 23.

Torsion for rotating the rotating portion 21 is provided by the first elastic sheet 41 of the torsion device 40. Torsion for rotating the connecting portion 23 is provided by the second elastic sheet 62 of the torsion assembly 60. The tightness degree of the first nut 43 and the second nut 63 directly affects the compression and the torsion of the first elastic sheet 41 and the second elastic sheet 62, respectively. In the embodiment, the rotation includes two rotation strokes, that is, the rotation of the rotating portion 21 and the rotation of the connecting portion 23. The compression and the torsion of the first elastic sheet 41 and the second elastic sheet 62 determines a first rotation stroke and a second rotation stroke when a force is applied to the engaging portion 25. In an embodiment, the rotation of the rotating portion 21 is a first rotation stroke, and the rotation of the connecting portion 23 is a second rotation stroke. In another embodiment, the rotation of the connecting portion 23 is a first rotation stroke, and the rotation of the rotating portion 21 is a second rotation stroke. The whole rotation includes the two-stage rotation. The second rotation stroke is performed after the first rotation stroke is finished.

Refer to FIG. 7A, FIG. 7B, FIG. 8A and FIG. 8B. FIG. 7A and FIG. 7B are schematic diagrams showing a state of an electronic device in a second embodiment, respectively. FIG. 8A and FIG. 8B are schematic diagrams showing a state of a hinge component in a second embodiment. As shown in FIG. 7A and FIG. 7B, an electronic device 500 comprising a casing 510, a back plate 520 and hinge components 2. The hinge component 2 is similar to that of the first embodiment. The hinge components 2 are configured at two sides of the casing 510 and the back plate 520 of the electronic device 500 in pairs and symmetrically. The initial state of the hinge component 2 in the second embodiment is similar to that of the first embodiment, which is not repeated herein. In the embodiment, the rotation of the rotation portion 21 is regarded as a first rotation stroke, and the rotation of the connecting portion 23 is regarded as a second rotation stroke, which is not limited herein.

As shown in FIG. 7A and FIG. 8A, since the engaging portion 25 drives the rotating portion 21 and the connecting portion 23 to rotate, the central shaft 30 moves to the second position P2 of the curved guiding rail 111. For example, the angle θ between the connecting portion 23 and the fixing plate 13 is 90 degrees. That is, the back plate 520 and the casing 510 are perpendicular to each other. Then, as shown in FIG. 7B and FIG. 8B, the engaging portion 25 continues to drive the connecting portion 23 to rotate to make the rotating angle θ larger than 90 degrees. For example, the angle θ is 150 degrees. In this manner, the total rotating angle θ is large (for example, up to 180 degrees) via the two-stage rotation, even when the side plate 11 is thin and the curved guiding rail 111 is short.

Please refer to FIG. 6, the through hole 231 is arc-shaped, which is not limited herein. The connecting portion 23 is moved under the position limiting of the through hole 231. For example, in the second rotation stroke, the engaging portion 25 drives the connecting portion 23 to continue rotating, and the connecting portion 23 rotates along an arc-shape path under the position limitation of the arc shape of the through hole 231 and the rotating axis 27. That is, when the connecting portion 23 is driven to move while the rotating axis 27 does not move, the connecting portion 23 moves or rotates along the path corresponding to the shape of the through hole 231 under the position limiting of the rotating axis 27.

In addition, the rotating portion 21 further includes two position limiting protrusions 217. The position limiting protrusions 217 are protruded from a surface of the rotating portion 21 which faces to the connecting portion 23. A guiding slot 219 is formed between the two position limiting protrusions 217. The connecting portion 23 further includes a second sliding block 233. The second sliding block 233 is protruded from the surface of the connecting portion 23 which faces to the rotating portion 21. The second sliding block 233 is configured to correspond to the guiding slot 219. When the central shaft 30 is moved to the second position P2 of the curved guiding rail 111, and continues to make the connecting portion 23 to move, the position limiting protrusions 217 guide and limit the second sliding block 233 to slide along the guiding slot 219.

The fixing member of the hinge component in embodiments is assembled to a casing and a back plate of an electronic device. The fixing member is disposed inside the casing but not exposed. As a result, the electronic device is made thinner. The hinge component is not easily damaged under an external force. The lifecycle of the hinge component is improved. The rotating portion rotates around the connection of the back plate and the casing which is regarded as a virtual rotating axis. At the same time, the central shaft is driven to slide in the curved guiding rail. Consequently, the rotation range is large without being limited by the casing. As a result, various angles of the support are provided.

Although the invention has been disclosed with reference to certain embodiments thereof, the disclosure is not for limiting the scope. Persons having ordinary skill in the art may make various modifications and changes without departing from the scope of the invention. Therefore, the scope of the appended claims should not be limited to the description of the embodiments described above.

What is claimed is:

1. A hinge component for an electronic device, comprising: a fixing member, including a side plate and two fixing plates, the fixing plates extend from two ends of the side plate towards a direction, a curved guiding rail is formed on the side plate; a rotating member, including a rotating portion, a connecting portion and an engaging portion, the rotating portion includes a first through hole, the connecting portion is connected to the rotating portion, the engaging portion extends from the connecting portion; and a central shaft, passing through the first through hole and the curved guiding rail, two ends of the central shaft are fastened to the rotating portion and the side plate, respectively, to fix the rotating portion on the side plate, when the engaging portion is driven to make the rotating portion rotate, the central shaft is driven to slide along the curved guiding rail; wherein when the central shaft is in a first position along the curved guiding rail, the engaging portion is parallel to the two fixing plates, when the rotating portion rotates to make the central shaft move to a second position along the curved guiding rail, an angle is formed between the engaging portion and the fixing plate.

2. The hinge component according to claim 1, wherein the hinge component further includes a torsion device configured on the central shaft and abutted against the rotating portion, the torsion device includes a first elastic sheet and a first nut, the first elastic sheet is sleeved on the central shaft and abutted against the rotating portion, and the first nut is sleeved on the central shaft and fixes the first elastic, sheet on the central shaft.

3. The hinge component according to claim 1, wherein the hinge component further includes a cover, the cover is fixed on a side of the rotating portion to shield the rotating portion and the central shaft.

4. The hinge component according to claim 1, wherein the hinge component further includes a position limiting portion, a first sliding block is disposed on the rotating portion, the first sliding block is protruded from the rotating portion, the position limiting portion is disposed above the curved guiding rail, located on a surface of the side plate, and corresponds to the first sliding block.

5. The hinge component according to claim 4, wherein the side plate further includes an abutting portion, the abutting portion extends from the position limiting portion, and locates at an end of the curved guiding rail which is close to the second position.

6. The hinge component according to claim 1, wherein the rotating member further includes a rotating axis, the rotating portion further includes a second through hole, the connecting portion includes a through hole, the rotating axis passes through the second through hole and the through hole, and two ends of the rotating axis are fastened in the rotating portion and the connecting portion, respectively, to make the connecting portion connected with the rotating portion.

7. The hinge component according to claim 6, wherein when the central shaft is moved to the second position along the curved guiding rail, the connecting portion is perpendicular to the fixing plate, and the rotating portion rotates around the rotating axis.

8. The hinge component according to claim 6, wherein the hinge component further includes a torsion assembly, the torsion assembly is configured to the rotating axis, the torsion assembly includes a spacer, a second elastic sheet and a second nut, the spacer is sleeved on the rotating axis and abutted against the connecting portion, the second elastic sheet is sleeved on the rotating axis and abutted against the spacer, the second nut is sleeved on the rotating axis to fix the spacer and the second elastic sheet on the rotating axis.

9. The hinge component according to claim 6, wherein the rotating portion further includes two position limiting protrusions, the two position limiting protrusions are protruded from a surface of the rotating portion, a guiding slot is formed between the two position limiting protrusions, the connecting portion further includes a second sliding block, the second sliding block is protruded from a surface of the connecting portion and corresponds to the guiding slot, and the two position limiting protrusions guide and limit the second sliding block to slide along the guiding slot.

10. An electronic device, comprising: a casing; a back plate; and a hinge component connecting to the casing and the back plate, including: a fixing member, including a side plate and two fixing plates, the fixing plates fixed inside the casing extend from two ends of the side plate along a direction, a curved guiding rail formed on the side plate; a rotating member, including a rotating portion, a connecting portion and an engaging portion, wherein the rotating portion includes a first through hole, the connecting portion connects to the rotating portion, and the engaging portion that extends from the connecting portion and fixed on the back plate; and a central shaft, passing through the first through hole and the curved guiding rail, two ends of the central shaft are fastened to the rotating portion and the side plate, respectively, to fix the rotating portion on the side plate, when the engaging portion is driven to make the rotating portion rotate, the central shaft is driven to slide along the curved guiding rail; wherein when the central shaft is in a first position along the curved guiding rail, the engaging portion is parallel to the two fixing plates, when the rotating portion rotates to make the central shaft move to a second position along the curved guiding rail, an angle is formed between the engaging portion and the fixing plate.

* * * * *